(12) United States Patent
Morrissey et al.

(10) Patent No.: US 9,963,777 B2
(45) Date of Patent: May 8, 2018

(54) METHODS OF FORMING A THIN FILM RESISTOR

(71) Applicant: Analog Devices, Inc., Norwood, MA (US)

(72) Inventors: Michael Noel Morrissey, Limerick (IE); Bernard Patrick Stenson, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 589 days.

(21) Appl. No.: 13/646,940

(22) Filed: Oct. 8, 2012

(65) Prior Publication Data

US 2014/0097081 A1   Apr. 10, 2014

(51) Int. Cl.
C23C 14/00 (2006.01)
C23C 14/34 (2006.01)
(Continued)

(52) U.S. Cl.
CPC .............. *C23C 14/34* (2013.01); *C23C 14/16* (2013.01); *C23C 14/541* (2013.01); *H01C 7/006* (2013.01);
(Continued)

(58) Field of Classification Search
CPC ..... C23C 14/14; C23C 14/0688; C23C 14/16; C23C 14/165; C23C 14/18; C23C 14/185; C23C 14/0682; C23C 14/0036
See application file for complete search history.

(56) References Cited

U.S. PATENT DOCUMENTS 3,603,768 A    9/1971  Ireland et al.
3,912,611 A *  10/1975 Royer et al. ............. 204/192.15
(Continued)

FOREIGN PATENT DOCUMENTS

CN    1938449       1/2011
CN    102314978 A   1/2012
(Continued)

OTHER PUBLICATIONS

Felmetsger, Valery V., Controlled Sputtering Enables Better SiCr Films, Sputtered Films Inc. The 42nd Interface Microlithography Symposium, Oct. 2005.*

(Continued)

*Primary Examiner* — John J Brayton
(74) *Attorney, Agent, or Firm* — Knobbe, Martens, Olson & Bear, LLP

(57) ABSTRACT

Methods of forming a thin film are disclosed. One such method can include sputtering a target material to form a first thin film resistor and adjusting a parameter of deposition to modulate a property of a subsequently formed second thin film resistor. For instance, a substrate bias and/or a substrate temperature can be adjusted to modulate a property of the second thin film resistor. A temperature coefficient of resistance (TCR) and/or another property of the second thin film resistor can be modulated by adjusting the parameter of deposition. The target material sputtered onto the substrate can include, for example, a Cr alloy, a Ni alloy, SiCr, NiCr, or the like. A relationship can be established between the substrate bias and/or substrate temperature and the thin film resistor property, and the relationship can be used in selecting deposition conditions for a desired property value.

27 Claims, 3 Drawing Sheets

(51) Int. Cl.

| | | |
|---|---|---|
| *H01C 17/12* | (2006.01) | |
| *C23C 14/16* | (2006.01) | |
| *C23C 14/54* | (2006.01) | |
| *H01C 7/00* | (2006.01) | |
| *H01C 7/06* | (2006.01) | |
| *H01C 17/232* | (2006.01) | |
| *H01L 49/02* | (2006.01) | |

(52) U.S. Cl.
CPC ............... *H01C 7/06* (2013.01); *H01C 17/12* (2013.01); *H01C 17/232* (2013.01); *H01L 28/24* (2013.01)

(56) References Cited

U.S. PATENT DOCUMENTS

| | | | | |
|---|---|---|---|---|
| 4,021,277 | A | * | 5/1977 | Shirn ..................... C23C 14/00 204/192.22 |
| 4,210,996 | A | | 7/1980 | Amemiya et al. |
| 4,467,312 | A | | 8/1984 | Komatsu |
| 4,505,032 | A | | 3/1985 | Praria |
| 4,606,781 | A | | 8/1986 | Vyne |
| 4,615,944 | A | | 10/1986 | Gardner |
| 4,636,448 | A | | 1/1987 | Morita et al. |
| 4,681,812 | A | * | 7/1987 | Schuetz .............. C23C 14/0036 204/192.21 |
| 4,684,454 | A | | 8/1987 | Gardner |
| 4,713,680 | A | | 12/1987 | Davis et al. |
| 4,721,658 | A | | 1/1988 | Gardner |
| 4,833,043 | A | | 5/1989 | Gardner |
| 4,885,069 | A | | 12/1989 | Coad et al. |
| 5,015,989 | A | | 5/1991 | Wohlfarth et al. |
| 5,635,893 | A | | 6/1997 | Spraggins et al. |
| 6,042,686 | A | * | 3/2000 | Dible ................ H01J 37/32009 118/723 E |
| 6,246,243 | B1 | | 6/2001 | Audy |
| 6,636,143 | B1 | | 10/2003 | Hashimoto et al. |
| 7,084,691 | B2 | | 8/2006 | Hsu |
| 7,119,656 | B2 | | 10/2006 | Landsberger et al. |
| 7,239,006 | B2 | | 7/2007 | Coolbaugh et al. |
| 7,598,841 | B2 | | 10/2009 | McGuinness et al. |
| 7,719,403 | B2 | | 5/2010 | McGuinness et al. |
| 2003/0211757 | A1 | * | 11/2003 | Gondhalekar .... C23C 16/45563 438/788 |
| 2005/0001241 | A1 | | 1/2005 | Doyle |
| 2006/0028894 | A1 | | 2/2006 | Brennan et al. |
| 2007/0056850 | A1 | | 3/2007 | Ye et al. |
| 2009/0174520 | A1 | * | 7/2009 | Wada et al. ..................... 338/25 |
| 2010/0000855 | A1 | | 1/2010 | Nakamura et al. |
| 2010/0245030 | A1 | * | 9/2010 | Ikeda et al. ................... 338/307 |
| 2010/0301989 | A1 | * | 12/2010 | Felmetsger ............ H01C 7/006 338/308 |
| 2012/0049324 | A1 | | 3/2012 | LeNeel et al. |
| 2012/0098593 | A1 | | 4/2012 | Downey et al. |

FOREIGN PATENT DOCUMENTS

| | | |
|---|---|---|
| CN | 102376404 A | 3/2012 |
| DE | 4005851 | 8/1991 |
| EP | 0 033 155 | 1/1981 |
| JP | 02054757 | 2/1990 |
| JP | 06-084621 | 3/1994 |
| JP | 2004108866 | 4/2004 |
| SU | 834784 | 5/1981 |
| SU | 1092576 A | 5/1984 |
| WO | WO 86/02492 | 4/1986 |
| WO | WO 91/13448 | 5/1991 |
| WO | WO 2005/004207 | 1/2005 |

OTHER PUBLICATIONS

U.S. Appl. No. 13/553,894, filed Jul. 20, 2012, titled "Method for Altering Electrical and Thermal Properties of Resistive Materials", in 16 pages.

International Search Report and Written Opinion of PCT/US2011/056909 dated Jan. 31, 2012.

Feldbaumer et al., "Pulse Current Trimming of Polysilicon Resistors." Transactions on Electron Devices, vol. 42, No. 4, Apr. 1995. pp. 689-695.

Chinese Office Action dated Dec. 22, 2015 in Chinese Application No. 201310463852.X in 7 pages.

Chinese Office Action dated Mar. 23, 2017 in CN 201310463852.X in 7 pages.

Tianjin University Wireless Materials and Elements Research Department, Resistors, Jan. 1980.

Sheet Resistance, Wikipedia, accessed May 19, 2017, last edited Oct. 16, 2016.

Chinese Office Action dated Sep. 12, 2017 from counterpart Chinese Application No. 201310463852.X in 6 pages.

\* cited by examiner

METHODS OF FORMING A THIN FILM RESISTOR

TECHNICAL FIELD

The disclosed technology relates to depositing a material on a substrate, and more particularly, to forming a thin film resistor on a substrate.

DESCRIPTION OF THE RELATED TECHNOLOGY

A target material can be deposited on a substrate by sputtering, a form of physical vapor deposition (PVD), to form a thin film on the substrate. In sputter deposition, the composition and/or properties of a thin film is typically adjusted by using a different target material.

Reactive sputtering is a method of modulating a material being sputtered on a substrate. The primary control over modulating sputtered material in reactive sputtering is over the proportion of reactive gas additive, such as $N_2$ for N-incorporation.

A need exists to improve control of properties of thin films, such as thin film resistors, that are formed from sputtering. Moreover, a need exists to form thin films with desired properties in a cost effective manner.

SUMMARY OF CERTAIN INVENTIVE ASPECTS

One aspect of this disclosure is a method of forming thin film resistors. A material is sputtered to form a first thin film resistor. This sputtering is non-reactive sputtering. After sputtering the material to form the first thin film resistor, a parameter of deposition is adjusted. Then a second thin film resistor is formed by sputtering substantially the same material with the adjusted deposition parameter to modulate a temperature coefficient of resistance (TCR) of the second thin film resistor relative to a TCR of the first thin film resistor.

Another aspect of this disclosure is a method of forming thin film resistors. A material is sputtered on a first substrate to form a first thin film resistor on the first substrate. A substrate bias is adjusted to modulate a property of a second thin film resistor relative to the same property of the first thin film resistor. The second thin film resistor is formed on a second substrate by sputtering with the adjusted substrate bias.

Another aspect of this disclosure is a method of forming a thin film on a substrate. The method includes heating the substrate to a temperature selected in the range from about 500° C. to 1000° C., and sputtering a material on a substrate at the temperature to form the thin film on the substrate. In this method, the material sputtered on the substrate at the temperature includes SiCr and/or NiCr.

Yet another aspect of this disclosure is a method of forming a thin film resistor. A value for a property of a thin film resistor is selected. A value for a deposition parameter associated with the selected property value is obtained based on a relationship between the deposition parameter and the property. The deposition parameter includes at least one of a substrate bias or a substrate temperature. The deposition parameter is set to the obtained value for the deposition parameter. While the deposition parameter is at the obtained value, a target material is caused to be sputtered onto a substrate to form a thin film resistor having the selected value for the property.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

Figure 1:
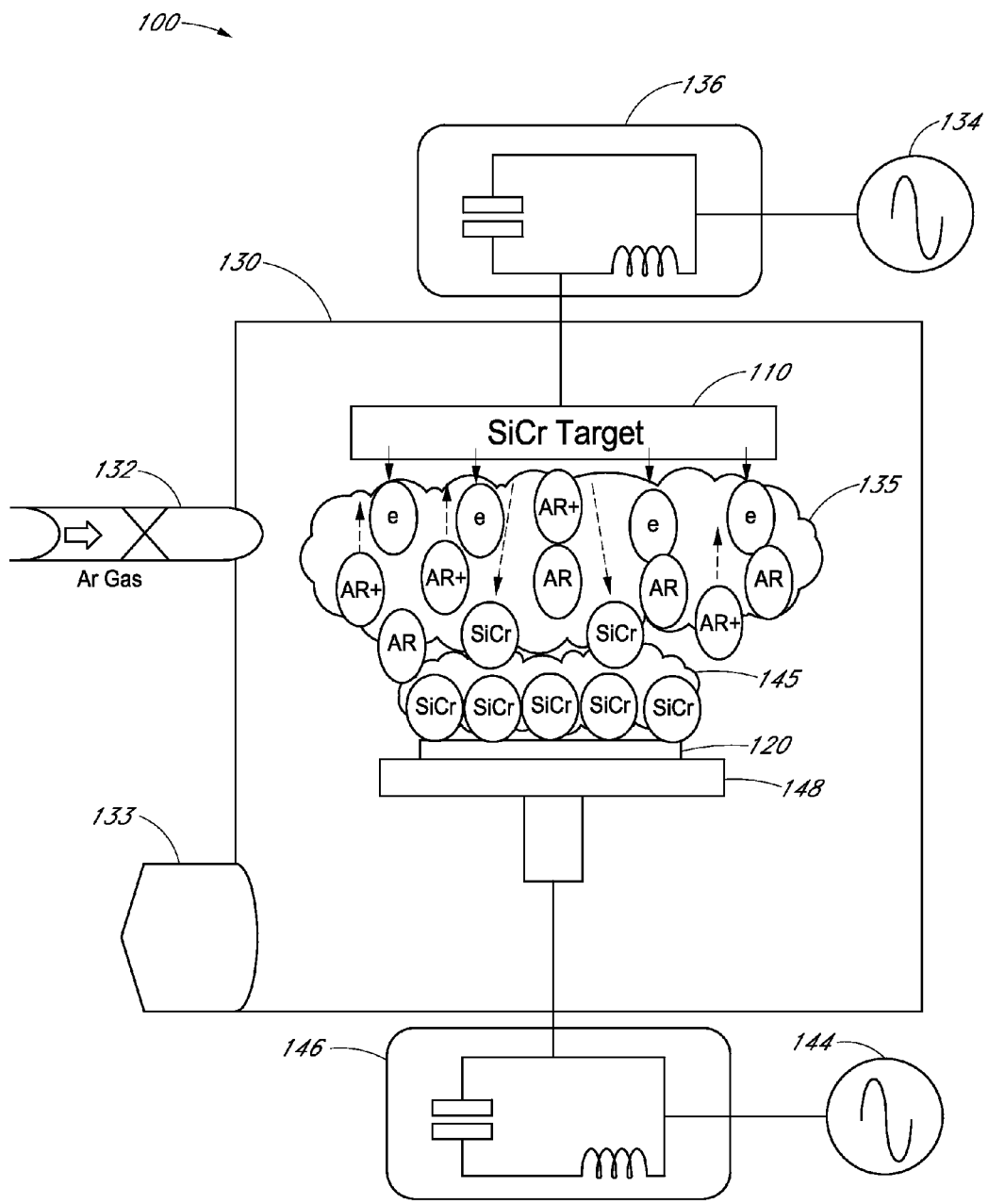
FIG. 1 is a schematic diagram of an example deposition apparatus for forming a thin film on a substrate.

Sputtering systems, such as RF sputtering systems, can be difficult to set up and to maintain. Adjusting any parameter of deposition can affect other parameters of deposition and/or properties of a thin film formed by deposition. Sputtering equipment is accordingly often configured such that particular parameters of deposition have been fixed. As one example, sputtering equipment can have a fixed substrate bias that is not adjustable without modifying the deposition apparatus. In other examples, sputter equipment can have adjustable bias within narrow ranges but is fixed for deposition after initial equipment set-up.

According to embodiments described herein, a property of a thin film resistor, such as a temperature coefficient of resistance (TCR), can be modulated by adjusting the composition of the target material. For instance, thin film resistors formed by PVD can be generated by cermet target materials. A cermet material includes a ceramic component and a metallic component. TCR has conventionally been adjusted by adjusting ratios of ceramic components and metallic components in cermet target materials. Adjusting these ratios has been an iterative process, which is both time consuming and expensive. More generally, developing new target materials can be a slow and/or iterative process. Thus, it has been expensive to develop new target materials in order to obtain a desired property of a sputtered thin film.

Aspects of this disclosure relate to sputtering a material on a substrate to form a thin film on the substrate and adjusting a parameter of deposition to modulate a property of a subsequently formed thin film. For example, a first thin film resistor can be formed on a first substrate, then substrate bias and/or substrate temperature can be adjusted, and a second thin film resistor can be formed on a second substrate with the adjusted substrate bias and/or substrate temperature. In this example, a substrate bias and/or a substrate temperature can be adjusted to modulate a property of the second thin film resistor compared to the first thin film resistor. Such adjustment can modulate one or more properties, such as a temperature coefficient of resistance (TCR), of a thin film resistor. After adjusting a parameter of deposition, thin films with desired properties can be formed with a desired deposition parameter value. For instance, after adjusting substrate temperature, a substrate can be heated to a particular temperature (for example, a temperature selected in the range from about 500° C. to 1000° C.) for forming thin film resistors. Some examples of other properties that can be modulated by adjusting a parameter of sputtering include uniformity, density and resistivity.

The thin film resistors formed by sputtering can include, for example, a cermet material that includes a ceramic component and a metallic component, a Cr alloy such as SiCr or NiCr, a Ni alloy such as NiCr, or the like. In a cermet material, the metallic component can include a Cr or Ni alloy. As used herein "SiCr" is not intended to convey stoichiometry, and "SiCr" can refer to an alloy that includes about 10%-50% Si by mass and about 5%-70% Cr by mass. Likewise, as used herein "NiCr" does not convey stoichiometry, and "NiCr" can refer to an alloy that includes about 10%-50% Ni by mass and about 5%-70% Cr by mass. The thin film resistors formed by sputtering can include other elements in combination with SiCr or NiCr, such as ceramic components and/or trace elements.

The methods of forming a thin film resistor described herein may be able to achieve one or more of the following advantages, among others. A property of a sputtered thin film can be modulated without changing a target material. Thus, in certain embodiments, a single target material can be used to form thin film resistors with different properties. For instance, the single target material can be used to form thin film resistors having substantially the same resistance and different TCR values by modifying a deposition parameter. As such, thin film resistors with different properties can be formed in a single chamber, even without changing the target. According to the principles and advantages described herein, a single target material can produce thin film resistors with a single resistance value and a range of TCR values.

FIG. 1 is a schematic diagram of an example deposition apparatus 100 suitable for forming any of the thin films described herein on a substrate. The illustrated deposition apparatus 100 is configured for radio frequency (RF) sputtering in which a material from a target 110 can be deposited on a substrate 120. The substrate 120 can be any suitable substrate for receiving a thin film of the target material, such as a semiconductor wafer with a partially fabricated integrated circuit. As illustrated, the target 110 can include SiCr according to certain embodiments. In some other embodiments, the target 110 can include any of the target materials referenced herein, particularly those suited for fabrication of a thin film resistor.

An inert gas, such as argon gas, can be supplied to a chamber 130 via an inlet 132. An ultra high vacuum pump 133 can create a vacuum in the chamber 130 suitable for plasma generation for RF sputtering. RF sputtering can enable a uniform deposition of very thin film, such as films with a thickness of less than about 100 Å, for example, a film with a thickness of about 40 Å. A high frequency RF generator 134 and an impedance matching network 136 can be used to power the target 110 to generate a target plasma 135 from the inert gas supplied to the chamber 130. The high frequency RF generator 134 can generate a signal with any suitable frequency. In the illustrated deposition apparatus 100, the high frequency RF generator 134 can generate signals with a frequency of about 13.56 MHz. The target plasma 135 can function as a rectifier that generates an average negative voltage at the target 110. The matching network 136 can include a direct current (DC) blocking capacitor configured to compensate for varying impedance.

Positively charged argon or other noble gas ions can be strongly attracted to the negatively charged target 110. The positively charged argon ions can collide with a surface of the target 110, dislodging atoms of the target material 110, such as SiCr atoms for a SiCr target material. Alternation of the potential at RF ensures maintenance of the target plasma 135. Sputtering can refer to this dislodging of atoms from a target from collisions with positively charged argon ions. The sputtered atoms of the target material travel across the chamber 130 to the substrate 120 where the sputtered atoms deposit as a thin film on the substrate 120.

A bias plasma 145 can also be generated at the substrate 120 by a second high frequency RF generator 144 and a second matching network 146. The bias plasma 145 can be generated independently of the target 110. As illustrated, a voltage can be applied via the second matching network 146 to an anode 148 on which the substrate 120 is positioned. The applied voltage that generates the bias plasma can be a relatively low voltage.

The bias voltage applied to the substrate 120 can be adjustable. For instance, a voltage level applied to the substrate 120 can be adjusted. Alternatively or additionally, a power of a signal applied to the substrate 120 can be adjusted. As one example, a duty cycle of a voltage pulse applied to the substrate 120 can be adjusted. In certain embodiments, the bias voltage applied to the substrate 120 can be selected in the range from about 20 volts to 100 volts. In some of these embodiments, the bias voltage applied to the substrate can be selected in the range from about 30 volts to 50 volts. Adjusting the bias plasma can modulate a property, such as TCR, of the thin film being formed on the substrate 120. Accordingly, a particular substrate bias can be selected such that the thin film formed by sputtering in the deposition chamber 130 has a desired property, such as a desired TCR value. In this way, adjusting the substrate bias can modulate the TCR of the thin film resistor formed on the substrate.

Figure 2:
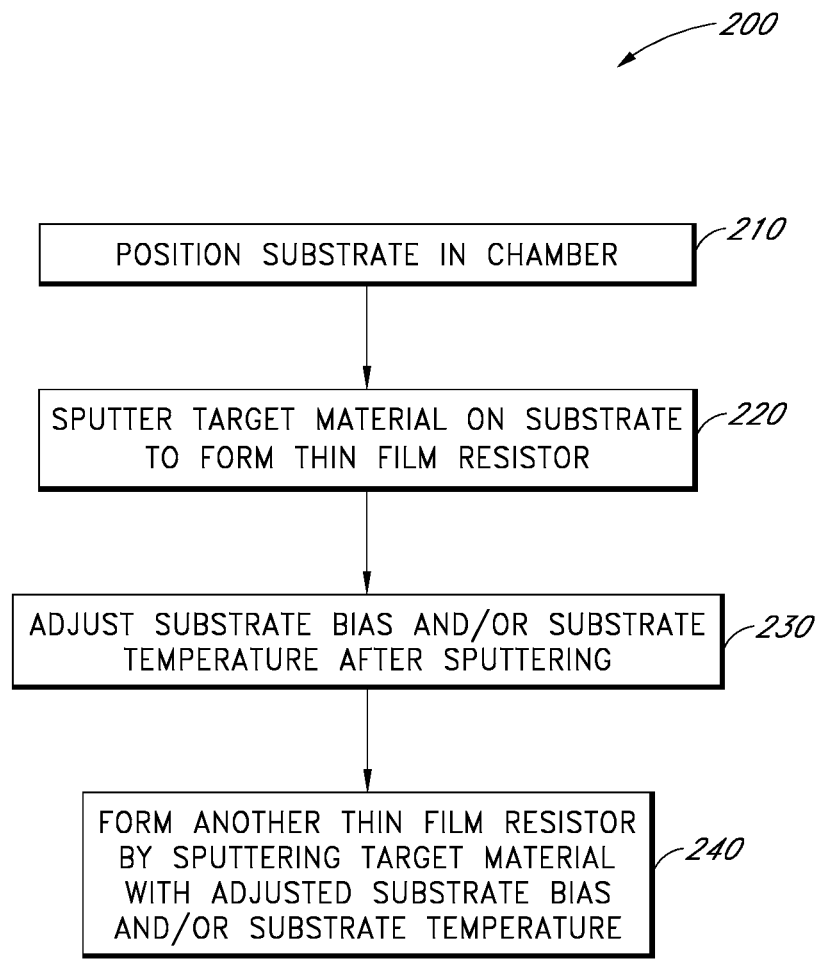
FIG. 2 is a flow diagram of a method of forming a thin film resistor according to an embodiment.

FIG. 2 is a flow diagram of a method 200 of forming a thin film resistor according to an embodiment. The method 200 can be performed in any suitable deposition apparatus, such as the deposition apparatus 100. The method 200 can be performed, for example, in the Applied Materials ENDURA™ 5500, the Oerlikon CLUSTERLINE Sputter System, the Oerlikon EVOII Sputter System, modified versions of the same, or the like. As one example, the method 200 can be part of a process of forming a 2 kΩ thin film resistor.

At block 210, a substrate can be positioned in a deposition chamber. The substrate can be any suitable substrate, such as a silicon substrate or other semiconductor substrate. In certain embodiments, the substrate can be positioned on an anode. The substrate bias can be applied to the substrate via the anode.

A target material can be sputtered on the substrate to form a thin film resistor at block 220. The target material can include a cermet, a Cr alloy, a Ni alloy, SiCr, NiCr, or the like. The sputtering can be non-reactive sputtering, such as RF non-reactive sputtering. The sputtering can include DC sputtering or RF sputtering. In certain embodiments, the thin film formed on the substrate can have a thickness selected in the range from about 20 Å to 5,000 Å. According to some of these embodiments, the thin film formed on the substrate can have a thickness selected in the range from about 10 Å to 200 Å or the range from about 40 Å to 1000 Å. Sputtering can form a thin film that is about 20 atoms thick according to various implementations. The thin film resistors formed at block 220 can include any combination of features of the thin film resistors described herein, for example, with reference to FIGS. 3A and/or 3B.

At block 230, a parameter of deposition can be adjusted after forming the thin film resistor at block 220 to modulate a property of a subsequently formed thin film resistor. For instance, substrate bias and/or substrate temperature can be adjusted. This can control a property, such as a TCR, of the subsequently formed thin film resistor. In this way, a single target material in one chamber can be used to form different thin film resistors with a range of TCR values. For example, changing substrate bias and/or substrate temperature can adjust the TCR of a subsequently formed thin film resistor while the subsequently formed thin film resistor has substantially the same resistance and/or resistivity as the thin film resistor formed at block 220. Two thin film resistors can have substantially the same resistance and/or resistivity when their respective resistances and/or resistivities vary by less than about 3%. In certain embodiments, the TCR can be adjusted between values in the range from about 25 ppm/° C. to 500 ppm/° C. for thin film resistors having substantially the same resistance and/or resistivity. TCR can be adjusted between values in the range from about 0 ppm/° C. to 300 ppm/° C. according to some of these embodiments. While the description of FIG. 2 may refer to TCR as an example property of a thin film resistor for illustrative purposes, it will be understood that the principles and advantages described with reference to TCR can be applied to other thin film resistor properties, such as without limitation uniformity, density, or resistivity.

In accordance with some embodiments, a substrate bias can be adjusted at block 230. For instance, a voltage and/or a power of a signal applied to the substrate can be varied. Changing the substrate bias can cause a composition and/or a density of a thin film resistor to be modulated. Adjusting substrate bias can cause TCR of the thin film resistor to be modulated.

Alternatively or additionally, substrate temperature can be adjusted at block 230. According to certain embodiments, the substrate temperature can be varied within a range from about 200° C. to 1200° C. Modulation within high temperature ranges (e.g., about 500° C. or 1000° C.) can improve property sensitivity to temperature changes. In some of these embodiments, the substrate temperature can be at least about 600° C., for example, about 600° C. or 1000° C. In another embodiment, the substrate temperature can be at least about 750° C., for example, about 750° C. or 1000° C. Forming a thin film resistor at higher substrate temperatures can increase TCR for the same material being sputtered on a substrate. For instance, adjusting temperature can modulate a surface mobility of the thin film resistor, resulting in a modulated TCR of a subsequently formed thin film resistor relative to the thin film resistor formed at block 220.

At block 240, another thin film resistor can be formed by sputtering substantially the same target material with the adjusted substrate bias and/or substrate temperature. The thin film resistor formed with the adjusted substrate bias and/or substrate temperature can otherwise be formed in substantially the same way as the thin film resistor formed at block 220. In this way, a thin film resistor having a property modulated relative to a previously formed thin film resistor can be formed from the substantially the same target material. The thin film resistor formed at block 240 can be formed on a different substrate than the thin film resistor formed at block 220. The thin film resistors formed at blocks 220 and 240 can be formed within the same chamber of a deposition apparatus, such as the deposition apparatus 100 shown in FIG. 1.

In some embodiments, the operations at blocks 230 and 240 can be iterated until one or more deposition parameters that produce a desired property of a thin film are identified. A relationship can then be established between a deposition parameter and a desired property of a thin film resistor formed by sputtering. For example, a relationship can be established between substrate bias (and/or substrate temperature) and TCR. In this example, the relationship can be used to select a substrate bias (and/or substrate temperature) for forming a thin film resistor with a desired TCR. Such a relationship can be, for example, a formula, an algorithm, or a look-up table. It will be understood that the relationship used to select a value of a deposition parameter can depend on the sputtering tool and/or other recipe parameters. One example relationship is provided in Equation 1:

$$TCR = 0.6 \times \text{Bias Voltage} - 127 \qquad \text{(Equation 1)}$$

In Equation 1, TCR can be measured in ppm/° C., the bias voltage can represent the substrate bias voltage in volts, a first constant (i.e., 0.6 in Equation 1) by which the bias voltage is multiplied can have units of $$\frac{ppm}{°C. * V},$$

and a second constant (i.e., 127 in Equation 1) subtracted from the product of the first constant and the bias voltage can have units of ppm/° C.

Once a substrate temperature that results in a desired property of the thin film resistor (for example, a desired TCR value, a desired uniformity, a desired density, or a desired resistivity) is identified, a target material can subsequently be sputtered onto a substrate and the substrate can be heated to the desired temperature. For instance, a substrate can be heated to a temperature selected in the range from about 500° C. to 1000° C. and then a material alloy, such as SiCr or NiCr, can be sputtered on a substrate to form a thin film resistor. Likewise, once a substrate bias that results in a desired property of the thin film resistor is identified, a target material can subsequently be sputtered onto a substrate while the identified bias is applied to the substrate.

Identifying a selected substrate temperature and/or substrate bias can be based on applying a relationship previously established by iterative experimentation. For instance, a relationship between a deposition parameter, such as a substrate bias or a substrate temperature, and a property, such as TCR, of thin film resistors can be obtained. Using the relationship, the deposition parameter can be set to a selected value corresponding to a desired property value. While the deposition parameter is at the selected value, a target material can be sputtered onto a substrate to form a thin film resistor having the desired property value. The target material can be any of the target materials described herein, such as a Cr alloy or a Ni alloy.

Resistance can be inversely proportional to thickness of a thin film formed from a particular target material. Adjusting substrate bias and/or substrate temperature may not affect the thickness of the thin film and consequently may not affect the resistance of the thin film resistor formed by sputtering. Thus, by adjusting substrate bias and/or substrate temperature, a single target material can produce thin film resistors with a range of TCR values, and can do so without substantially affecting resistance (for a given resistor geometry) or resistivity.

Figure 3A:
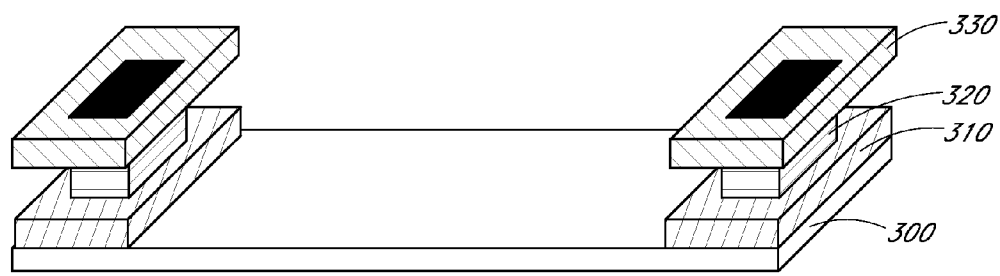
FIG. 3A is a schematic isometric view of a thin film resistor.
Figure 3B:
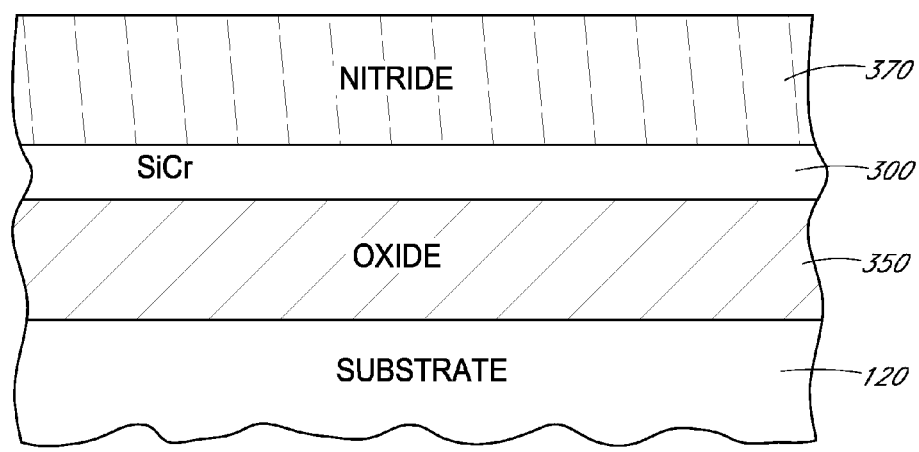
FIG. 3B is a cross section of a thin film resistor.

FIGS. 3A and 3B illustrate a thin film resistor 300. FIG. 3A shows a thin film resistor 300 that can be formed by any of the sputtering processes described herein. The thin film resistor 300 can be electrically connected to other circuit elements by electrically conductive features formed on a substrate. One or more of these electrically conductive features can also be formed by sputtering. For example, a contact tab 310 for the thin film resistor 300 can be formed by way of sputtering. The contact tab 310 can be TiW in accordance with some embodiments. A contact plug 320 can provide an electrical connection between the contact tab 310 and a conductive wire 330. The contact plug 320 can be formed by filling a via in an interlevel dielectric (omitted from the illustration for clarity). The conductive wire 330 can be formed by sputtering. According to a number of embodiments, the conductive wire 330 can include aluminum. The conductive wire 330 can be an elongate line, only part of which is shown, leading to other circuit elements of an integrated circuit.

FIG. 3B illustrates a cross-sectional view of a thin film resistor 300 and adjacent layers on a substrate 120, outside of a contact region. For example, the cross-sectional view can represent the environment of the thin film resistor 300 between the opposing contact tabs 310 illustrated in FIG. 3A. According to certain embodiments, the thin film resistor 300 can be disposed between an oxide layer 350 and a nitride layer 370. As illustrated in FIG. 3B, the oxide layer 350 can be disposed above the substrate 120. The thin film resistor 300 can be disposed above the oxide layer 350. The nitride layer 370 can be disposed above the thin film resistor. The thin film resistor 300 can have a thickness selected in the range from about 40 Å to 500 Å according to some embodiments. The oxide layer 350 can have a thickness, for example, from about 500 Å to 2500 Å. The nitride layer 370 can have a thickness, for example, from about 1000 Å to 3000 Å. As one example, a 20 kΩ thin film resistor can include a SiCr layer with a thickness of between about 80 Å and 100 Å that is disposed between an oxide layer with a thickness of about 1500 Å and a nitride layer with a thickness of about 2000 Å. It will be understood that these layers can have any suitable thicknesses for a desired application. For instance, thin film resistors of substantially the same materials, widths and lengths but with different thicknesses can have different resistance values, since resistance can be inversely proportional to the thickness of the thin film. As an example, thin film resistors formed of substantially the same material and having substantially the same widths and lengths with thicknesses of 40 Å, 80 Å, and 400 Å, respectively, can have resistances of 1 kΩ, 500Ω, and 100Ω, respectively. The thin film resistor 300 can have a resistance, for example, that is anywhere from milli-ohms to mega-ohms. In certain implementations, the resistance of the thin film resistor 300 can be selected in the range from about 100Ω to 20 kΩ.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. For instance, it will be understood that the principles and advantages discussed herein can be used in any suitable methods related to depositing a thin film by sputtering. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A method of forming thin film resistors, the method comprising:
    sputtering a single target material to form a first thin film resistor while applying a radio frequency (RF) substrate bias having a first RF bias level such that no other target material is sputtered to form the thin film resistor, said sputtering being non-reactive RF sputtering;
    adjusting the RF substrate bias to have a second RF bias level after sputtering the single target material to form the first thin film resistor, the second RF bias level being different from the first RF bias level; and
    after adjusting the RF substrate bias, forming a second thin film resistor by non-reactively sputtering substantially the same single target material while applying the RF substrate bias having the second RF bias level to modulate a temperature coefficient of resistance (TCR) of the second thin film resistor relative to a TCR of the first thin film resistor, wherein the second thin film resistor has a non-zero TCR and a resistance of at least 2 kilo-ohms.

2. The method of claim 1, wherein the single target material comprises at least one of a Cr alloy or a Ni alloy.

3. The method of claim 1, further comprising varying a substrate temperature prior to said forming the second thin film resistor to further modulate the TCR of the second thin film resistor.

4. The method of claim 1, further comprising adjusting a substrate temperature after the first thin film resistor is formed and prior to forming the second thin film resistor, the adjusted substrate temperature being above 500° C.

5. The method of claim 1, wherein the TCR of the first thin film resistor and the TCR of the second thin film resistor are each in a range from +25 ppm/° C. to +500 ppm/° C.

6. The method of claim 1, wherein the first thin film resistor and the second thin film resistor are formed on different substrates.

7. The method of claim 1, wherein the first thin film resistor and the second thin film resistor have substantially the same resistance, and wherein the resistance is between 20 kilo-ohms and 1 mega-ohm.

8. The method of claim 1, wherein the first thin film resistor and the second thin film resistor formed by RF sputtering have thicknesses in the range from about 20 Å to 5,000 Å.

9. A method of forming thin film resistors, the method comprising:
    radio frequency (RF) sputtering a material on a first substrate to form a first thin film resistor on the first substrate, the first thin film resistor having a first resistance of at least 2 kilo-ohms;
    applying an RF substrate bias across the first substrate at a first RF bias level during the RF sputtering, the RF sputtering being non-reactive sputtering;
    adjusting the RF substrate bias to modulate a property of a second thin film resistor relative to the same property of the first thin film resistor, the adjusted RF bias having a second RF bias level that is different than the first RF bias level; and
    forming the second thin film resistor with a non-zero temperature coefficient of resistance (TCR) on a second substrate, the second thin film resistor being formed by non-reactive RF sputtering, wherein the adjusted RF substrate bias is applied to the second substrate, and wherein the second thin film resistor has a second resistance of at least 2 kilo-ohms.

10. The method of claim 9, wherein the material comprises at least one of a Cr alloy or a Ni alloy.

11. The method of claim 9, wherein the property of the second thin film resistor is the non-zero TCR, and wherein the non-zero TCR is in a range from +25 ppm/° C. to +500 ppm/° C.

12. The method of claim 11, wherein adjusting modulates the non-zero TCR of the second thin film resistor, and wherein the first thin film resistor has substantially the same resistance as the second thin film resistor, and wherein the second resistance of the second thin film resistor is between 20 kilo-ohms and 1 mega-ohm.

13. The method of claim 9, wherein the second substrate is heat to at least 500° C. while the second thin film resistor is formed.

14. The method of claim 9, wherein adjusting comprises varying at least one of a voltage or a power of the adjusted RF substrate bias applied to the second substrate compared to the respective voltage or power of the RF substrate bias applied to the first substrate.

15. The method of claim 9, further comprising varying a temperature of the second substrate relative to a temperature of the first substrate to further modulate the property of the second thin film resistor.

16. The method of claim 9, wherein forming the second thin film resistor comprises RF sputtering substantially the same material on the second substrate.

17. A method of forming a thin film resistor on a substrate, the method comprising:
    heating the substrate to a temperature selected in the range from about 500° C. to 1000° C.; and
    sputtering a material on a substrate at the temperature to form the thin film resistor on the substrate, the material comprising at least one of SiCr or NiCr; and
    wherein the thin film resistor formed by sputtering has a non-zero temperature coefficient of resistance (TCR).

18. The method of claim 17, wherein the temperature is at least about 600° C.

19. The method of claim 17, wherein the thin film resistor has a resistance in a range from one milli-ohm to one mega-ohm.

20. The method of claim 1, wherein the single target material comprises a ceramic component and a metallic component.

21. The method of claim 17, wherein the sputtering comprises non-reactive RF sputtering.

22. A method of forming a thin film resistor, the method comprising:
    selecting a value for a property of a thin film resistor, wherein the property is a temperature coefficient of resistance (TCR) in a range from +25 ppm/° C. to +500 ppm/° C.;
    obtaining a value for a deposition parameter associated with the selected property value from a non-reactive sputtering relationship between the deposition parameter and the property, wherein the deposition parameter comprises a radio frequency (RF) substrate bias voltage determined based at least in part on a proportional relationship with the TCR and also on an offset amount;
    setting the deposition parameter to the obtained value for the deposition parameter; and
    while the deposition parameter is at the obtained value, causing a target material to be non-reactively RF sputtered onto a substrate to form a thin film resistor having the selected value for the property; and
    wherein the target material is from only one target.

23. The method of claim 22, wherein the target material comprises at least one of a Cr alloy or a Ni alloy.

24. The method of claim 17, wherein sputtering the material comprises radio frequency (RF) sputtering the material and applying an RF bias to the substrate.

25. The method of claim 22, wherein the thin film resistor has a resistance of at least 2 kilo-ohms.

26. The method of claim 1, wherein applying the RF substrate bias having the first RF bias level comprises applying the RF substrate bias to an anode positioned across a substrate on which the first thin film resistor is formed.

27. The method of claim 17, wherein the material that is sputtered onto the substrate is from only one target.

* * * * *